(12) United States Patent
Lee

(10) Patent No.: US 7,145,166 B2
(45) Date of Patent: Dec. 5, 2006

(54) CMOSFET WITH HYBRID STRAINED CHANNELS

(75) Inventor: Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 160 days.

(21) Appl. No.: 10/922,087

(22) Filed: Aug. 19, 2004

(65) Prior Publication Data
US 2006/0038199 A1 Feb. 23, 2006

(51) Int. Cl.
 *H01L 29/06* (2006.01)
 *H01L 31/072* (2006.01)
 *H01L 31/109* (2006.01)
 *H01L 31/0328* (2006.01)
 *H01L 31/0336* (2006.01)

(52) U.S. Cl. .......................... 257/18; 257/19; 257/338; 257/357; 257/369; 257/371

(58) Field of Classification Search ................ 257/19, 257/338, 357, 369, 371, 18
See application file for complete search history.

(56) References Cited

U.S. PATENT DOCUMENTS

| | | | |
|---|---|---|---|
| 6,482,705 B1 | 11/2002 | Yu | |
| 6,492,216 B1 | 12/2002 | Yeo et al. | |
| 6,621,131 B1 | 9/2003 | Murthy et al. | |
| 6,630,714 B1 | 10/2003 | Sato et al. | |
| 6,703,271 B1 | 3/2004 | Yeo et al. | |
| 6,727,550 B1* | 4/2004 | Tezuka et al. | 257/347 |
| 6,844,227 B1* | 1/2005 | Kubo et al. | 438/216 |
| 6,847,098 B1* | 1/2005 | Tseng et al. | 257/647 |
| 6,943,407 B1* | 9/2005 | Ouyang et al. | 257/329 |
| 6,992,025 B1* | 1/2006 | Maa et al. | 438/795 |
| 7,015,517 B1* | 3/2006 | Grant et al. | 257/190 |
| 2002/0179946 A1* | 12/2002 | Hara et al. | 257/288 |
| 2004/0227169 A1* | 11/2004 | Kubo et al. | 257/288 |
| 2005/0242398 A1* | 11/2005 | Chen et al. | 257/348 |

OTHER PUBLICATIONS

Yee-Chia Yeo et al., "Design and Fabrication of 50-nm Thin-Body p-MOSFETs With a SiGe Heterostructure Channel", IEEE Transactions On Electron Device, Feb. 2002, pp. 279-286, vol. 49, No. 2, 0018-9383/02.

* cited by examiner

*Primary Examiner*—Ida M. Soward
(74) *Attorney, Agent, or Firm*—Haynes and Boone, LLP

(57) ABSTRACT

Disclosed is a method of manufacturing microelectronic devices including forming a silicon substrate with first and second wells of different dopant characteristics, forming a first strained silicon-germanium-carbon layer of a first formulation proximate to the first well, and forming a second strained silicon-germanium-carbon layer of a second formulation distinct from the first formulation proximate to the second well. Capping and insulating layers, gate structures, spacers, and sources and drains are then formed, thereby creating a CMOS device with independently strained channels.

18 Claims, 5 Drawing Sheets

CMOSFET WITH HYBRID STRAINED CHANNELS

BACKGROUND

Formation of a semiconductor transistor typically comprises a doped substrate featuring a source and a drain bounded by dielectric regions, a gate dielectric layer, and a gate. One method of increasing the performance of that composition is enhancement of carrier mobility by introduction of a strained channel beneath the gate and between the source and drain.

The conventional approach to creating this strained channel is the replacement of a silicon substrate with bulk silicon-germanium, which is graded so as to produce relaxed silicon-germanium at the wafer surface. The silicon-germanium is then covered (capped) with epitaxial silicon. The difference in lattice constants between the silicon cap and the underlying silicon-germanium produces tensile stress in the silicon, and thus more carrier mobility in the silicon cap. A disadvantage with this approach is that the substitution of silicon substrate with relaxed silicon-germanium is both expensive and time-consuming. A further disadvantage is that dislocations in the silicon-germanium lattice are difficult to control and can spread into the strained silicon layer, degrading that layer and hampering performance. The higher the level of defect control, the more expensive the process becomes.

Another approach is capping a doped silicon substrate with an epitaxial layer of strained silicon-germanium. As in the conventional approach, the difference in lattice constants between the silicon-germanium and the silicon produces stress in the capped layer. Since the layers are reversed from the conventional approach, the silicon is relaxed while the silicon-germanium is compressively stressed. The strain produces the same benefit of enhanced carrier mobility. Unlike the conventional approach, this process is not expensive since the growth of a thin layer of stressed silicon-germanium is cheaper and less time-consuming than the growth of a thick layer of relaxed silicon-germanium. A disadvantage is that this method only improves p-channel metal oxide semiconductor (PMOS) performance, but degrades n-channel metal oxide semiconductor (NMOS) performance. An alternative is the use of a thin silicon-carbon layer instead of a silicon-germanium layer. The difference in lattice constants for the silicon-carbon on silicon configuration puts tensile, rather than compressive, stress on the silicon-carbon cap. However, this method only improves NMOS performance, but degrades PMOS performance.

It is desired to provide strained channels that improve different types of channels and devices, such as complementary metal oxide semiconductor (CMOS) devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increase or reduced for clarity of discussion.

DETAILED DESCRIPTION

The following disclosure provides many different embodiments or examples for implementing different features of various embodiments. Specific examples of components and arrangements are described below only to simplify the disclosure. These are merely examples and are not intended to be limiting. Additionally, the present disclosure may repeat reference numbers and/or letters in the various examples. Such repetition is for the purposes of simplicity and clarity, and does not itself dictate a relationship between the various embodiments and/or configurations discussed herein. Moreover, the formation of a first feature proximate to a second feature in the description that follows may include embodiments in which the first and second features are formed in direct contact as well as embodiments in which additional features may be formed interposing the first and second features such that the first and second features may not be in direct contact.

Unless specified otherwise, layer addition may comprise chemical vapor deposition (CVD), plasma-enhanced chemical vapor deposition (PECVD), atomic layer deposition (ALD), physical layer deposition, sputtering, spin-on-coating, and/or other additive processes. Unless specified otherwise, layer removal may comprise chemical mechanical polish (CMP), wet etch, dry etch, and/or other removal processes. Doping may comprise implantation, in situ growth, and/or other dopant addition processes.

Figure 1:
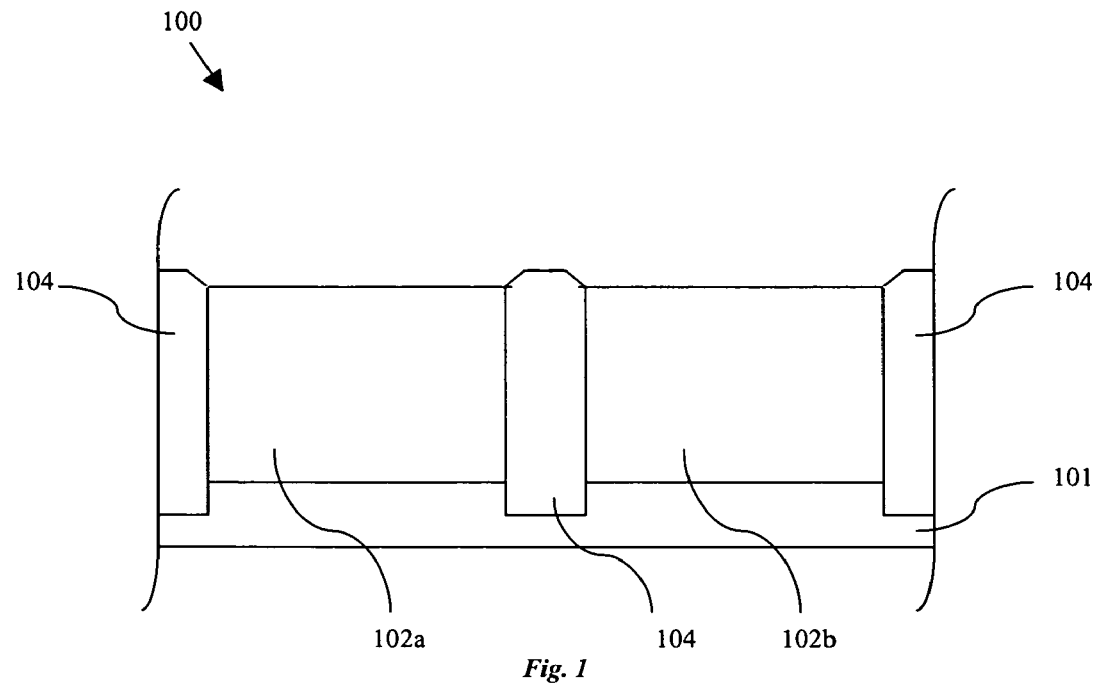
FIG. 1 is a cross-sectional view of at least a portion of one embodiment of a microelectronic device in an intermediate stage of manufacture according to aspects of the present disclosure.

FIG. 1 illustrates a sectional view of at least a portion of one embodiment of a microelectronics device 100 in an intermediate stage of manufacture according to aspects of the present disclosure. In one embodiment, the device may be fabricated on substrate 101 having doped well regions 102$a$ and 102$b$. The substrate 101 may comprise silicon, monocrystalline silicon, gallium-arsenide, and/or other materials. The differently doped well regions 102$a$ and 102$b$ may comprise any combination of substrate and one or more impurities in two different quantities in two different regions. In one embodiment, the differently doped well regions may comprise 102$a$ being a p-type region, indicating doping with a species such as boron, and 102$b$ being an n-type region, indicating doping with species such as arsenic and/or phosphorous. In another embodiment, the differently doped well regions may comprise 102$a$ being a p$^+$ region, indicating a high amount of doping with a species such as boron, and 102$b$ being a p$^{++}$ region, indicating a very high amount doping with a species such as boron. Formation of well regions is well known in the art, and one of ordinary skill may appreciate that certain combinations of different well regions are needed for certain devices.

In one embodiment, doped regions 102a and 102b may be separated by isolation structures 104. The isolation structures 104 may comprise a dielectric material such as silicon-oxide ($SiO_2$), silicon-nitride ($Si_3N_4$), and/or other low-k dielectric or electrically insulating materials. Formation of the isolation structures 104 may comprise local oxidation of silicon (LOCOS), shallow trench isolation (STI), and/or other methods.

Figure 2:
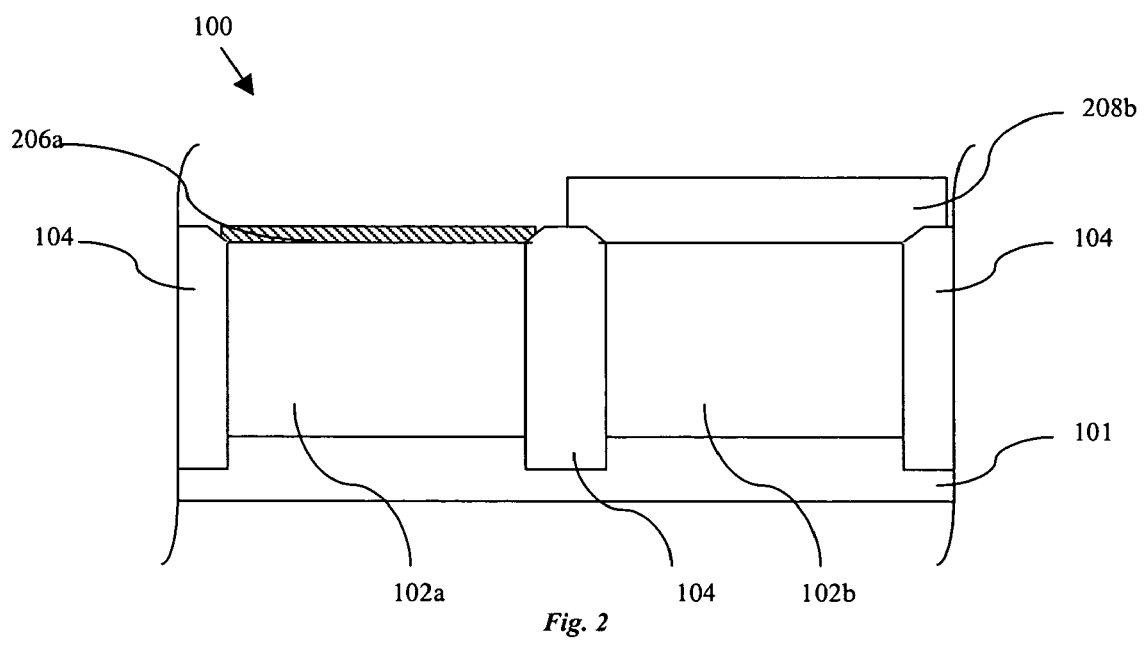
FIG. 2 is a cross-sectional view of the device shown in FIG. 1 in a subsequent stage of manufacture.
Figure 3:
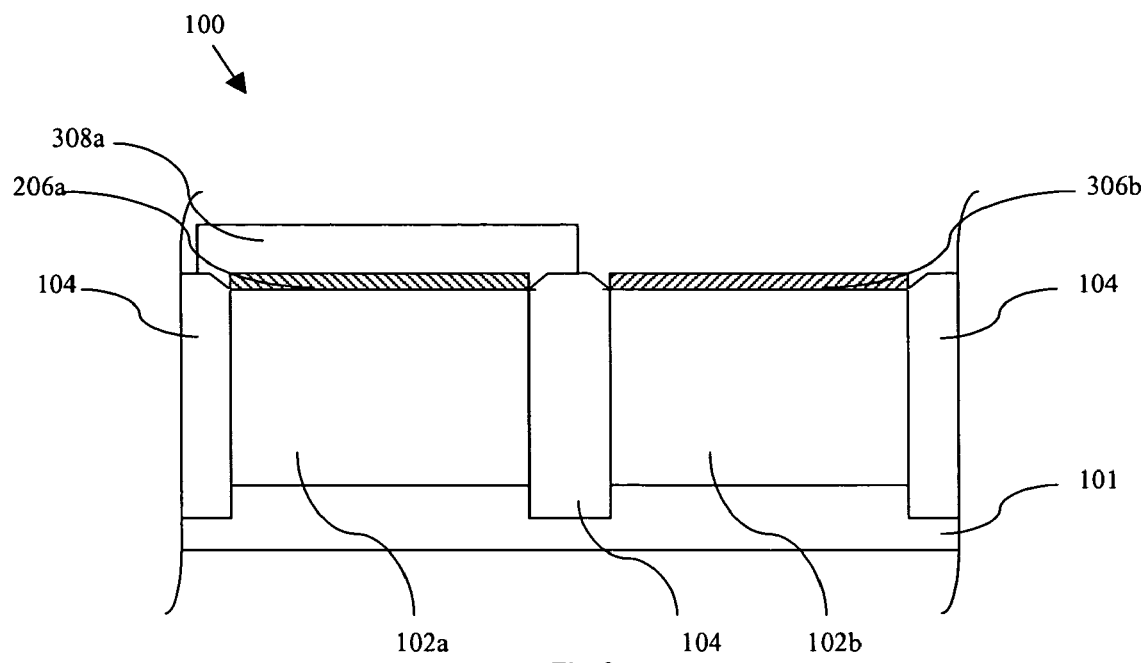
FIG. 3 is a cross-sectional view of the device shown in FIG. 2 in a subsequent stage of manufacture.

FIGS. 2 and 3 illustrate one method for forming a strained channel that works with different types of doped regions. Referring to FIG. 2, a first strained layer 206a by forming a hard mask 208b over one well 102b, while leaving the other well 102a uncovered. The hard mask 208b may comprise silicon-nitride, silicon-oxygen-nitride (SiON), and/or other deposition and/or implant resistive materials.

In one embodiment, the first strained layer 206a may comprise selective epitaxial growth (SEG) in areas where the substrate 101 is not covered by the hard mask 208b—which includes well 102a in the present example. The strained layer 206a can be formed using silane and/or disilane, germane, methane, and an etchant such as hydrochloric acid as reagents. After formation of the strained layer 206a, the hard mask 208b may be removed. If the embodiment contains isolation structures 104, the materials used for the hard mask 208b and the isolation structures 104 may be different to allow for selective removal and/or other processing at subsequent steps.

FIG. 3 illustrates a subsequent step to FIG. 2 in which a second hard mask 308a is formed over the first strained layer 206a. The second hard mask 308a may be similar in construction to the first hard mask 208b of FIG. 2. The second hard mask 308a permits formation of a second SEG strained layer 306b proximate to the second doped well 102b. In an embodiment where the second strained layer 306b is silicon-germanium-carbon, the layer may be formed using silane and/or disilane, germane, methane, and an etchant such as hydrochloric acid as reagents. After formation of the strained layer 306b, the hard mask 308a may be removed.

In some embodiments, the strained layers 206a and 306b may be tri-elemental, comprising silicon, germanium, and carbon in formulation, such as according to the following equation:

$$Si_{1-x-y}Ge_xC_y. \quad (1)$$

However, the fact that a tri-elemental layer substantially comprises three elements does not preclude composition of additional elements, be they impurities or desired species. The tri-elemental strained layers 206a and 306b may also comprise species added or removed by any subsequent processing, such as implant doping, to form a source and drain. Further, a tri-elemental layer may comprise substantially two elements such that it functions as a di-elemental layer, for example silicon-germanium-carbon with a only trace amount of carbon wherein y from equation (1) is nearly nil, leaving essentially $Si_{1-x}Ge_x$. This type of formulation allows for easier process modification to increase the relative amount of the trace third element, whereas use of a simple di-elemental layer might require process and tool redesign to achieve such an increase in the trace element. However, a di-elemental layer may be used when proper for the process and/or process tools.

In an embodiment where the strained tri-elemental layer 206a is silicon-germanium-carbon grown on the p-well 102a (in the present example), the germanium content may be about twenty to thirty mol percent. Applied to equation (1), x should be at least ten times y, such as:

$$Si_{0.74}Ge_{0.25}C_{0.01}.$$

As y approaches nil, the composition is essentially $Si_{1-x}Ge_x$. In embodiments where x is greater than ten times y, the lattice constant of the strained silicon-germanium-carbon layer 206a is higher than the lattice constant of the underlying substrate 102a, producing compressive strain in the silicon-germanium-carbon layer 206a.

In an embodiment where the a strained tri-elemental layer 306b is silicon-germanium-carbon grown on a well 102b (in the present example), the carbon content may be about two to three mol percent. Applied to equation (1), x should be less than ten times y, such as:

$$Si_{0.875}Ge_{0.1}C_{0.025}.$$

As x approaches nil, the composition is essentially $Si_{1-y}C_y$. In embodiments where x is less than ten times y, the lattice constant of the strained silicon-germanium-carbon layer 306b is lower than the lattice constant of the underlying n-type substrate 102b, producing tensile strain in the silicon-germanium-carbon layer 306b.

In order to be of distinct formulations, the tri-elemental strained layers 206a and 306b should have different lattice constants. In one embodiment, the distinct tri-elemental strained layer 206a may comprise silicon-germanium-carbon wherein carbon concentration is less than ten times germanium concentration and the distinct tri-elemental strained layer 306b being silicon-germanium-carbon wherein carbon concentration is greater than ten times germanium concentration. In another embodiment, the distinct tri-elemental strained layer 206a may comprise substantially silicon-germanium and the distinct tri-elemental strained layer 306b may comprise substantially silicon-carbon.

In some embodiments, the SEG strained tri-elemental layers 206a and 306b may be further processed to add and/or remove species with the hard masks 208b and 308a in place, with the hard masks 208b and 308a removed, or in combination. A process to add species may comprise implantation. Sacrificial layers such as silicon-oxide may be used to prevent surface damage caused by implantation. A process to remove species may comprise a leaching agent or layer.

Figure 4:
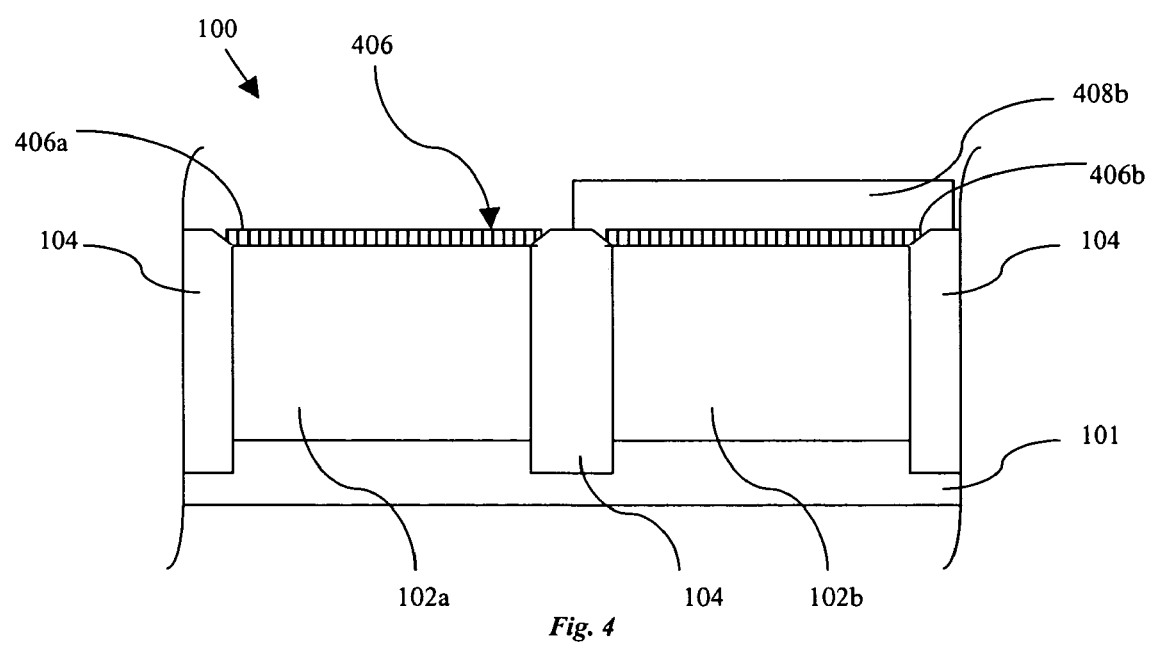
FIG. 4 is a cross-sectional view of the device shown in FIG. 1 in a subsequent stage of manufacture.
Figure 5:
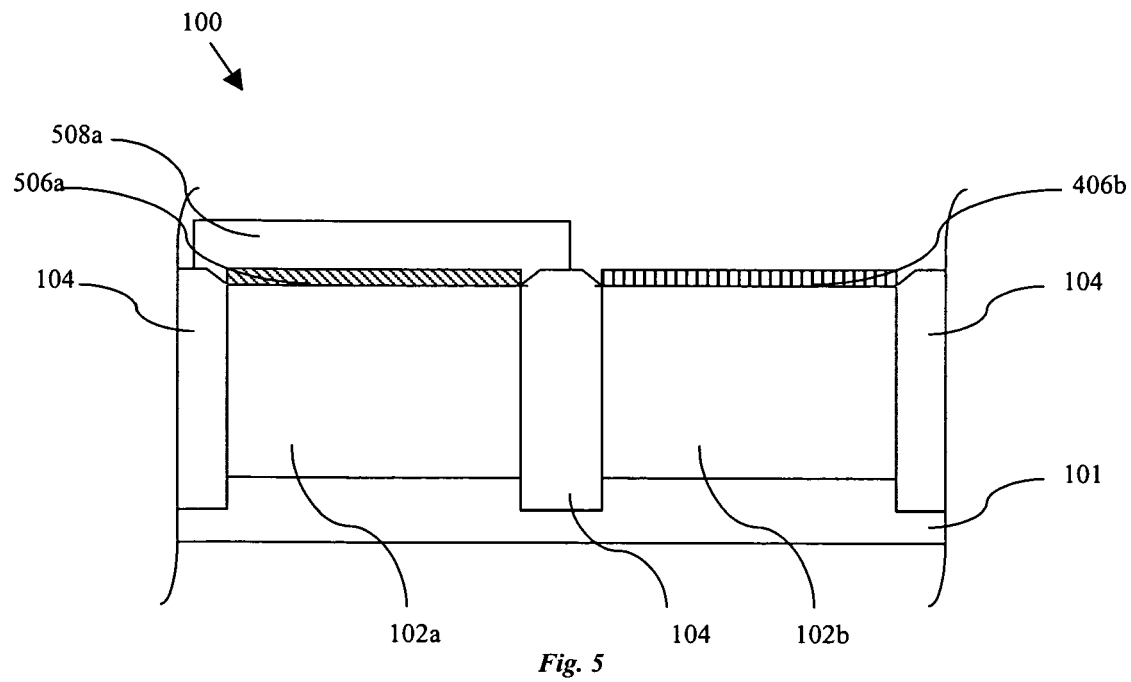
FIG. 5 is a cross-sectional view of the device shown in FIG. 4 in a subsequent stage of manufacture.

FIGS. 4 and 5 illustrate another method for forming a strained channel that works with different types of doped regions, such as is disclosed in FIG. 1. It is understood that the steps discussed above with FIGS. 2 and 3 can be used on some devices while the steps discussed below with FIGS. 4 and 5 can be used on other devices on the same wafer.

Referring to FIG. 4, a layer 406 may be formed over both the wells 102a and 102b. Formation of layer 406 may comprise SEG, non-selective epitaxial growth, and/or other means. In the present embodiment, the layer 406 includes the three elements silicon, germanium, and carbon.

After layer 406 has been formed, a hard mask 408b covers both well 102b and a portion 406b of layer 406 while leaving a portion 406a uncovered. The hard mask 408b may comprise silicon-nitride, silicon-oxygen-nitride, and/or other deposition and/or implant resistive materials. If the embodiment contains isolation structures 104, the materials used for the hard mask 408b and the isolation structures 104 may be different to allow for selective processing at subsequent steps.

Once the hard mask 408b is in place, subsequent processing can be performed to add species to and/or to remove species from layer 406a to produce the chemical formulation desired to achieve a certain lattice structure. For example, more or different materials can be implanted, thus changing layer 406a into something similar to tri-elemental strained layer 206a, discussed above. In an embodiment where the tri-elemental strained layer 206a is silicon-germanium-carbon, the implanted species may comprise germanium. Sacrificial layers such as silicon-oxide may also be used to prevent surface damage caused by implantation. In another embodiment, a process to remove species from the layer 406a may comprise a leaching agent or layer. After formation of the tri-elemental strained layer, now referred to as layer 506a (FIG. 5), the hard mask 408b may be removed.

Referring to FIG. 5, a hard mask 508a covers both well 102a and tri-elemental strained layer 506a while leaving the other well 102b and layer 406b uncovered. The hard mask 508a may comprise silicon-nitride, silicon-oxygen-nitride, and/or other deposition and/or implant resistive materials. If the embodiment contains isolation structures 104, the materials used for the hard mask 508a and the isolation structures 104 may be different to allow for selective processing at subsequent steps. Subsequent processing to add species to and/or to remove species from layer 406b may be used to produce the chemical formulation desired to achieve a certain lattice structure in the layer 406b, thus changing layer 406b into something similar to tri-elemental strained layer 306b, and distinct from tri-elemental strained layer 506a described in the preceding paragraph.

A process to add species may comprise implantation. In an embodiment where the tri-elemental strained layer is silicon-germanium-carbon, the implanted species may comprise carbon. Sacrificial layers such as silicon-oxide may be used to prevent surface damage caused by implantation. A process to remove species may comprise a leaching agent or layer. After formation of tri-elemental strained layer, the hard mask 508a may be removed. Although this embodiment illustrates treatment of layer 406a first, one of skill in the art will recognize that layer 406b may be treated first by covering layer 406a with hard mask 508a. Other embodiments may comprise alternating treatments wherein hard masks 408b and 508a are formed and removed more than once. Still other embodiments may comprise processes that affect both layers 406a and 406b or intermediaries.

Figure 6:
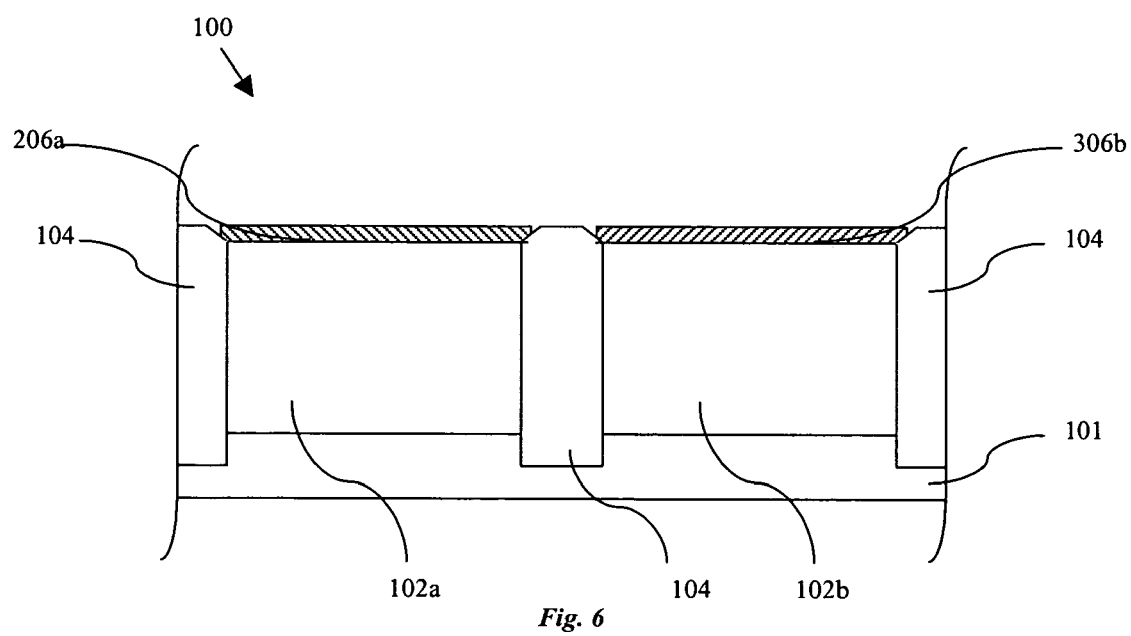
FIG. 6 is a cross-sectional view of the device shown in FIG. 3 or FIG. 5 in a subsequent stage of manufacture.

FIG. 6 illustrates one embodiment that may be formed using either the methods described with reference to FIGS. 2 and 3 or with reference to FIGS. 4 and 5. A first tri-elemental strained layer 206a (similar to layer 506 in FIG. 5) of one formulation is formed over doped region 102a, and a second tri-elemental strained layer 306b of a formulation distinct from tri-elemental strained layer 206a is formed over differently doped region 102b.

Figure 7:
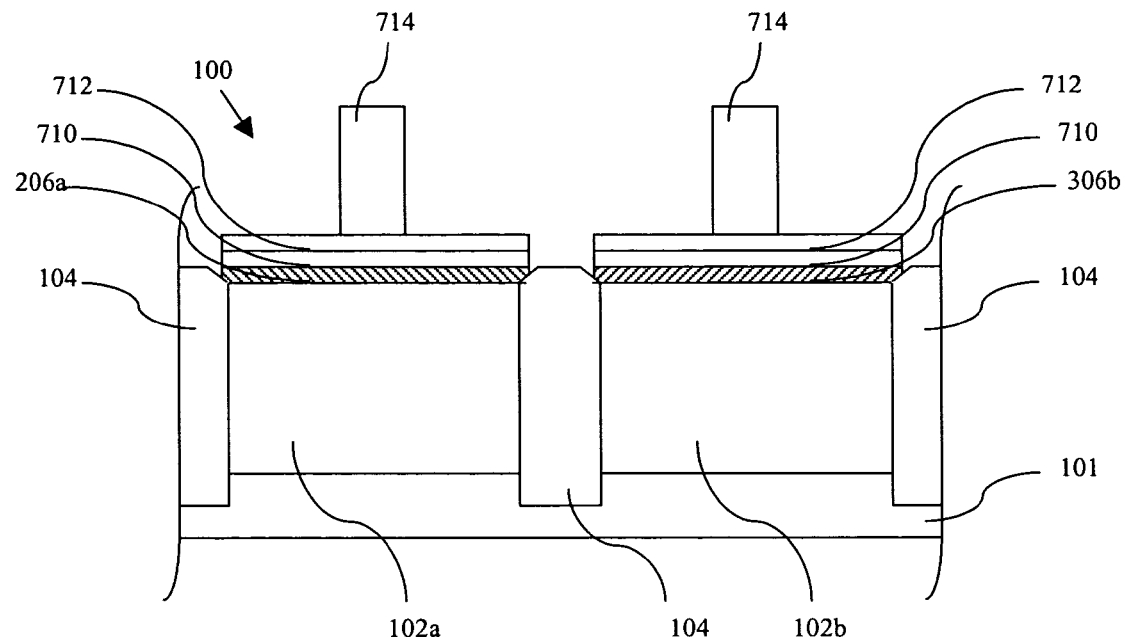
FIG. 7 is a cross-sectional view of the device shown in FIG. 6 in a subsequent stage of manufacture.

FIG. 7 illustrates subsequent processing in which the tri-elemental strained layers 206a and 306b may be capped with layer 710 and/or insulating layer 712. Capping layer 710 may comprise silicon. Insulating layer 712 may comprise silicon-oxide. In some embodiments, capping layer 710 may help to reduce stress between the tri-elemental strained layers 206a and 306b and subsequent insulating layer 712. In an embodiment where capping layer 710 is silicon and insulating layer 712 is silicon-oxide, capping layer 710 may serve as a silicon source for insulating layer 712. In some embodiments, capping layer 710 may prevent undesirable environmentally-induced oxidation of strained tri-elemental layers 206a and 306b. However, such oxidation may not occur in embodiments where the substrate never contacts an oxygenated atmosphere.

In a transistor embodiment, gate structures 714 may be formed on the insulating laye 712r. Formation of gate structures 714 is well-known in the art. Gate structure 714 materials may comprise doped or undoped silicon or polysilicon, and may be capped with a more conductive material such as tungsten, aluminum, copper, an alloy such as tungsten-silicide, or any other conductive or semiconductive material or combination of such materials. Representation in the drawing of gate structure 714 as a single layer does not preclude composition of multiple layers. In an embodiment where well region 102a is PMOS, well region 102b is NMOS, and there are gate structures 714 over both wells, a CMOS transistor is formed. In another embodiment, a mask may be used to form gate structures 714 proximate to only one well area, forming isolated transistors.

Figure 8:
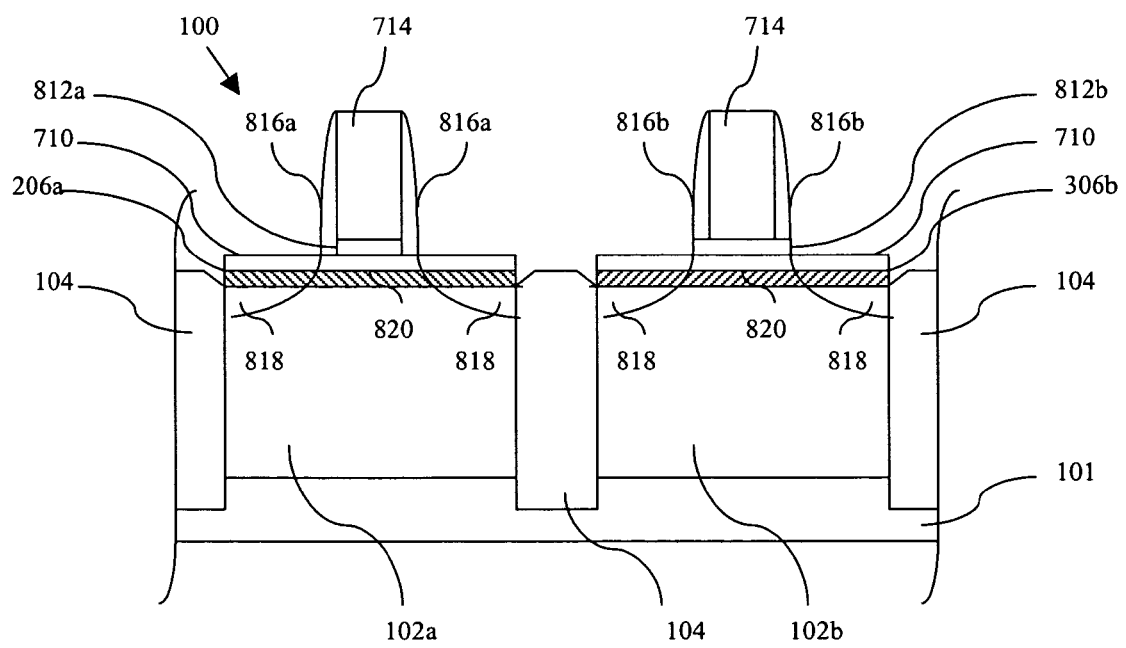
FIG. 8 is a cross-sectional view of the device shown in FIG. 7 in a subsequent stage of manufacture.

FIG. 8 illustrates further processing in which insulating structures 812a/812b and spacers 816a/816b may be formed around gate structures 714. Formation of insulating structures 812a/812b and spacers 816a/816b is well-known in the art. Insulating structures 812a/812b may have a width substantially similar to the width of gate structures 714 as shown by structure 812a or substantially similar to the width of spacers 816b as shown by structure 812b. The spacers 816 may comprise one or more layers of silicon-oxide, silicon-nitride, silicon-oxygen-nitride, and/or other materials. The spacers 816a/816b may independently or collectively be employed as a mask during subsequent processing to remove at least portions of insulating layer 712 as shown by structure 812b.

In one embodiment, the spacers 816a/816b may act as a mask or pattern for implantation of dopants such as boron, phosphorous, arsenic, and/or other materials into substrate wells 102a and 102b, strained layers 206a and 306b, and capping layer 710 to create sources and drains 818 and channel region 820. In another embodiment, a photoresist mask may be used to implant dopants into only certain wells. Subsequent diffusion, annealing, and/or any other electrical activation processes may be employed to attain a desired doping profile. In some embodiments, the sources and drains 818 may not have similar geometric shapes or compositions. For example, the thicknesses of the sources and drains 818 relative to the sum of the layers 102a, 102b, 206a, 306b, and 710 may differ, or the widths of the sources and drains 818 and the width of the gate structure 714 may differ. In one embodiment, the sources and drains 818 may be implanted before spacer 816a formation but after formation of isolation structure 812a in order to produce a more narrow channel 820.

Figure 9:
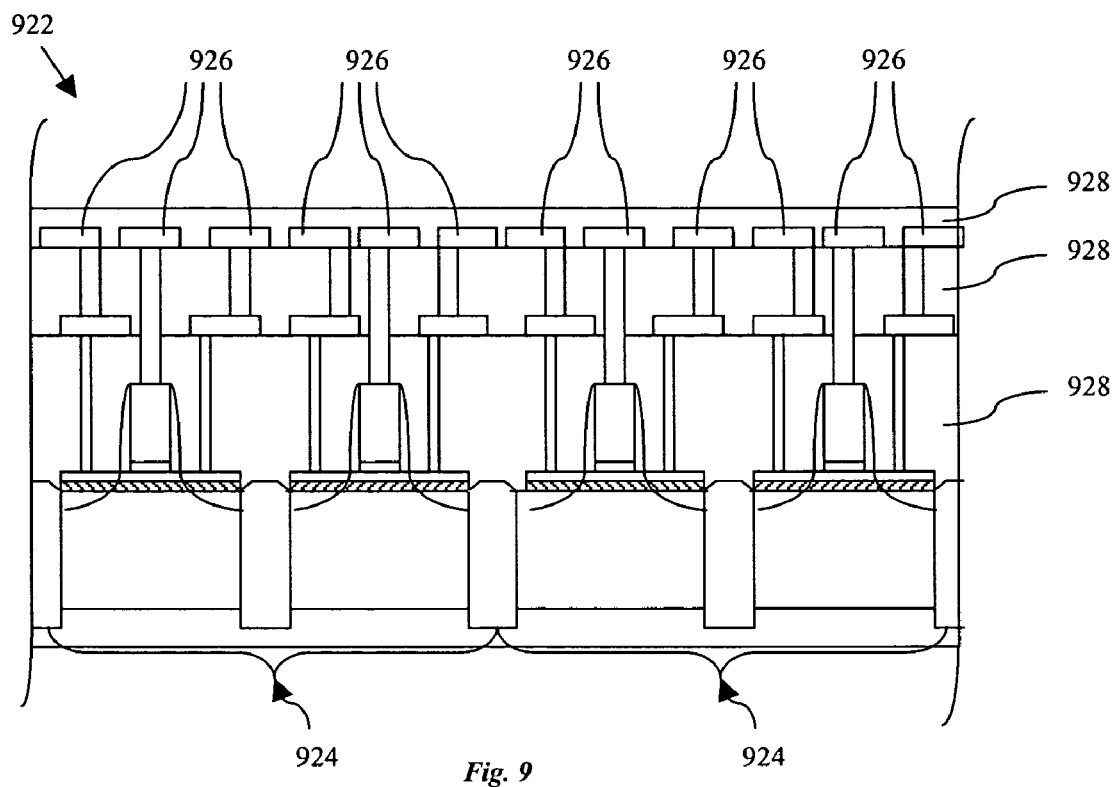
FIG. 9 is a cross-sectional view of at least a portion of one embodiment of an integrated circuit according to aspects of the present disclosure.

FIG. 9 illustrates an integrated circuit 922 in which the device 100 described above may be implemented. For example, the circuit 922 includes a plurality of microelectronic devices 924, one or more of which may be substantially similar to the device 100 shown in FIG. 8.

The integrated circuit 922 may also include interconnects 926 extending along and/or through one or more dielectric layers 928 to the devices 924. The interconnects 926 may comprise tungsten, aluminum, copper, and/or other materials. The interconnects 926 may further comprise a barrier metal layer between the bulk interconnect material and the dielectric layers 928. The barrier metal layer may comprise tantalum, titanium, titanium-nitride, tungsten, tungsten-silicide, tungsten-nitride, tantalum-silicon-nitride, and/or other suitable materials. The dielectric layers 928 may comprise silicon-oxide, carbon-doped silicon-oxide, fluorine-doped silicon-oxide, fluorosilicate glass (FSG), borophosphosilicate glass (BPSG), spin-on-glass (SOG), and/or any other low-k material.

Thus, the present disclosure provides a method of manufacturing a microelectronic device including forming first and second tri-elemental strained layers of distinct formulations over differently doped substrate.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectronic device comprising:
   a silicon substrate with first and second wells of different dopant characteristics;
   a first strained silicon-germanium-carbon layer of a first formulation proximate to the first well; and
   a second strained silicon-germanium-carbon layer of a second formulation distinct from the first formulation proximate to the second well.

2. The microelectronic device of claim 1 wherein the first and second wells of different dopant characteristics are separated by at least one isolation structure.

3. The microelectronic device of claim 2 wherein the isolation structure is a shallow trench structure.

4. The microelectronic device of claim 1 wherein the first dopant characteristic is n-type and the second dopant characteristic is p-type.

5. A microelectronic device comprising:
   a silicon substrate with first and second wells of different dopant characteristics;
   a first strained silicon-germanium-carbon layer of a first formulation proximate to the first well and comprising more than twenty mol percent germanium and less than two mole percent carbon; and
   a second strained silicon-germanium-carbon layer of a second formulation distinct from the first formulation proximate to the second well.

6. The microelectronic device of claim 1 wherein the second silicon-germanium-carbon formulation comprises more than two mol percent carbon and less than twenty mol percent germanium.

7. The microelectronic device of claim 5 further comprising a silicon capping layer proximate to the strained layers.

8. The microelectronic device of claim 7 further comprising an insulating layer proximate to the silicon capping layer.

9. The microelectronic device of claim 1 further comprising:
   a first gate structure proximate to the first well; and
   a second gate structure proximate to the second well.

10. A microelectronic device comprising:
    a substrate with wells of different dopant characteristics;
    a first strained tri-elemental layer of a first formulation epitaxially grown over one well; and
    a second strained tri-elemental layer of a second formulation distinct from the first formulation epitaxially grown over a different well.

11. The microelectronic device of claim 10 wherein the wells of different dopant characteristics are separated by at least one isolation structure.

12. The microelectronic device of claim 11 wherein the first dopant characteristic is p-type and the second dopant characteristic is n-type.

13. The microelectronic device of claim 10 wherein one tri-elemental formulation is silicon-germanium-carbon comprising about twenty to thirty mol percent germanium.

14. The microelectronic device of claim 10 wherein one tri-elemental formulation is silicon-germanium-carbon comprising about two to three mol percent carbon.

15. A microelectronic device comprising:
    a substrate with wells of different dopant characteristics;
    a first strained tri-elemental layer of a first formulation epitaxially grown over one well;
    a second strained tri-elemental layer of a second formulation distinct from the first formulation epitaxially grown over a different well; and
    a silicon capping layer proximate to the strained layers.

16. The microelectronic device of claim 15 further comprising an insulating layer proximate to the silicon capping layer.

17. The microelectronic device of claim 10 further comprising a gate structure proximate to each strained layer.

18. An integrated circuit device comprising:
    a plurality of microelectronic devices located at least partially in a silicon substrate having first and second wells of different dopant characteristics wherein at least one of the plurality of microelectronic devices comprises:
    a first strained silicon-germanium-carbon layer of a first formulation proximate to the first well; and
    a second strained silicon-germanium-carbon layer of a second formulation different from the first formulation proximate to the second well.

* * * * *